(12) United States Patent
Suga et al.

(10) Patent No.: US 11,395,422 B2
(45) Date of Patent: Jul. 19, 2022

(54) DISPLAY DEVICE

(71) Applicant: SHARP KABUSHIKI KAISHA, Sakai (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/277,030

(22) PCT Filed: Sep. 27, 2018

(86) PCT No.: PCT/JP2018/035960
§ 371 (c)(1),
(2) Date: Mar. 17, 2021

(87) PCT Pub. No.: WO2020/065828
PCT Pub. Date: Apr. 2, 2020

(65) Prior Publication Data
US 2021/0368637 A1 Nov. 25, 2021

(51) Int. Cl.
*G06F 1/16* (2006.01)
*H05K 5/02* (2006.01)
*H05K 5/00* (2006.01)

(52) U.S. Cl.
CPC ......... *H05K 5/0217* (2013.01); *G06F 1/1652* (2013.01); *H05K 5/0017* (2013.01)

(58) Field of Classification Search
CPC .. H05K 5/0217; H05K 5/0017; G06F 1/1652; G09F 9/00; G09F 9/30; G09F 9/301
See application file for complete search history.

(56) References Cited

U.S. PATENT DOCUMENTS

| | | | |
|---|---|---|---|
| 8,289,232 B2 * | 10/2012 | Kobayashi | G09F 13/22 345/204 |
| 9,098,241 B1 | 8/2015 | Cho et al. | |
| 9,900,977 B2 * | 2/2018 | Lee | G09F 9/301 |
| 10,321,584 B2 * | 6/2019 | Choi | H05K 5/0017 |
| 11,240,923 B2 * | 2/2022 | Wang | H05K 5/0017 |
| 2007/0188986 A1 | 8/2007 | Kobayashi | |
| 2010/0220060 A1 | 9/2010 | Kobayashi | |
| 2013/0010205 A1 | 1/2013 | Kobayashi | |
| 2014/0092566 A1 | 4/2014 | Shirasaka et al. | |
| 2016/0029474 A1 | 1/2016 | Cho et al. | |
| 2016/0120022 A1 * | 4/2016 | Lee | G06F 1/1652 361/749 |

(Continued)

FOREIGN PATENT DOCUMENTS

JP 2014-071613 A 4/2014
JP 2016-024460 A 2/2016

(Continued)

*Primary Examiner* — Hung S. Bui
*Assistant Examiner* — Sagar Shrestha
(74) *Attorney, Agent, or Firm* — ScienBiziP, P.C.

(57) ABSTRACT

A display device includes a flexible display panel, and an accommodation section configured to house the flexible display panel and provided with at least one movable guide member being movable and a plurality of fixed guide members configured to support the flexible display panel, where a distance between the at least one movable guide member and the plurality of fixed guide members at a time of pull-out is different from that at a time of housing.

12 Claims, 5 Drawing Sheets

(56) References Cited

U.S. PATENT DOCUMENTS

| | | | |
|---|---|---|---|
| 2016/0161983 A1* | 6/2016 | Lee | G09F 9/301 |
| | | | 361/749 |
| 2016/0165717 A1* | 6/2016 | Lee | G06F 1/16 |
| | | | 361/749 |
| 2016/0209879 A1* | 7/2016 | Ryu | G06F 1/1652 |
| 2017/0071066 A1 | 3/2017 | Cho et al. | |
| 2017/0196103 A1 | 7/2017 | Cho et al. | |
| 2017/0357287 A1 | 12/2017 | Yang | |
| 2018/0049328 A1* | 2/2018 | Choi | H05K 5/0217 |
| 2018/0098440 A1* | 4/2018 | Choi | G02F 1/133305 |
| 2018/0110137 A1* | 4/2018 | Kim | G02F 1/133305 |
| 2020/0058272 A1* | 2/2020 | Oh | G06F 3/0482 |
| 2021/0358344 A1* | 11/2021 | He | G09F 9/301 |

FOREIGN PATENT DOCUMENTS

| | | |
|---|---|---|
| JP | 2018-503866 A | 2/2018 |
| WO | 2005/086124 A1 | 9/2005 |
| WO | 2008/062532 A1 | 5/2008 |

\* cited by examiner

DISPLAY DEVICE

TECHNICAL FIELD

The disclosure relates to a display device configured to pull out or house a flexible display panel.

BACKGROUND ART

An electronic device disclosed in Patent Literature (PTL) 1 includes a first housing, a second housing, a flexible display, and a drive unit. The first housing has a first face where a keyboard is provided. The second housing has a second face that is foldably connected with the first housing, comes close to the first face in a folded state, and is spaced apart from the first face in an unfolded state.

The flexible display has a display surface on which an image is displayed, is housed in an accommodation section provided in the first housing in such a manner as to be able to exit therefrom and enter therein, covers the second face at least partially in a state in which at least part thereof exits from the accommodation section, and is supported by the first housing and the second housing. The drive unit moves when the first housing and the second housing are unfolded so as to move the flexible display in a direction in which the flexible display exits from the accommodation section, and moves as the first housing and the second housing are folded. As a result, the flexible display is moved in a direction of entering the accommodation section.

A rollable display device disclosed in PTL 2 relates to a rollable display device in which a printed circuit substrate connected to one edge portion of a display panel can be stably fixed, and the display panel can be wound and unwound in a fully automatic manner.

In a flexible display device disclosed in PTL 3, part of a connecting line from a connecting section is always wound around a first reel, whereby force received by the connecting section is dispersed, and thus the connecting line is difficult to be broken. The connecting line exhibits good connectivity in a process of a flexible display screen being extended or housed, and thus the reliability of the flexible display device is improved.

As illustrated in FIG. 5, according to a configuration of a flexible display of a known winding type, in order to achieve a scheme of winding or pulling out the display, a drive circuit substrate 100 needs to be rotated together with the display in each case. This causes the overall structure to be complicated.

Note that in FIG. 5, a reference numeral 101 indicates a display winding support body, a reference numeral 102 indicates a display wiring line area, a reference numeral 103 indicates a support body slit, and a reference numeral 104 indicates an external connection cable. Further, in FIG. 5, a reference numeral 105 indicates a display driver-mounted flex substrate, and a reference numeral 106 indicates a display area for display.

CITATION LIST

Patent Literature

PTL 1: JP 2014-071613 A
PTL 2: JP 2016-24460 A
PTL 3: JP 2018-503866 A

SUMMARY

Technical Problem

In PTL 1, it is disclosed that a display (display portion) is pulled out from a display device or housed therein by rotating and sliding the display device with a gear and a roller.

However, PTL 1 does not disclose a configuration to slide the roller itself that supports the display.

In PTL 2 and PTL 3 in the above citation list, only general techniques to wind the display panel and the display device are disclosed, but a configuration to slide the roller itself that supports the display is not disclosed.

In such circumstances, a rollable display in which the display is compactly housed by winding the display around a support body having a cylindrical shape is conceivable as one application product in which a display using a flexible substrate is mounted. It is a considerably challenging issue how to achieve a mechanism to wind a rollable display.

In such a display, a substrate equipped with an LSI and the like for controlling and inputting display signals is typically required to be connected to at least one side of the display, therefore, how to dispose this portion in a housing and mechanism is significantly important.

As a configuration generally conceivable, a configuration may be conceived in which a drive circuit substrate is housed in the interior of a tubular support body and a display portion is pulled out from a slit formed in the tubular support body, and the support body is rotated to wind the display around the support body so as to house the display.

However, it is difficult to precisely form such a hollow support body provided with a slit, and it is also difficult to attach a rotation mechanism. In addition, since the drive circuit needs to be set in the hollow through the slit, the installation is difficult, and it is also highly likely to damage the display or cable during assembly.

An aspect of the disclosure has been made in view of the above known problems, and an object thereof is to provide a display device that allows a flexible display panel to be housed by sliding a guide member itself configured to support the flexible display panel.

Solution to Problem

A display device according to an aspect of the disclosure does not have a configuration for winding a flexible display panel around a support body having a cylindrical shape in order to solve the above issues. The display device has a configuration in which a flexible display panel is pulled out or housed by a plurality of guide members in such a manner that a distance between at least one movable guide member and a plurality of fixed guide members at a time of the flexible display panel being pulled out is different from that at a time of the flexible display panel being housed.

Advantageous Effects of Disclosure

According to the above-described aspect of the disclosure, unlike the winding type display device, a drive circuit portion does not need rotation or movement action, so that a display device easy to install and unlikely to cause a failure may be provided.

In addition, according to the above-described aspect of the disclosure, since the display screen can be prevented from being overlapped and wound, it is possible to provide a display device able to reliably reduce stress applied to the display.

BRIEF DESCRIPTION OF DRAWINGS

FIG. 1(a) is an explanatory diagram illustrating a state in which a flexible display panel 1 is pulled out from an accommodation section 10. FIG. 1(b) is an explanatory diagram illustrating a case in which the flexible display panel 1 is housed.

FIG. 2 (a) is an explanatory diagram comparing a state in which the flexible display panel 1 is pulled out from the accommodation section 10 with a state in which the display device according to the first embodiment is pulled out. FIG. 2(b) is an explanatory diagram illustrating a case in which the flexible display panel 1 is housed.

DESCRIPTION OF EMBODIMENTS

Figure 5:
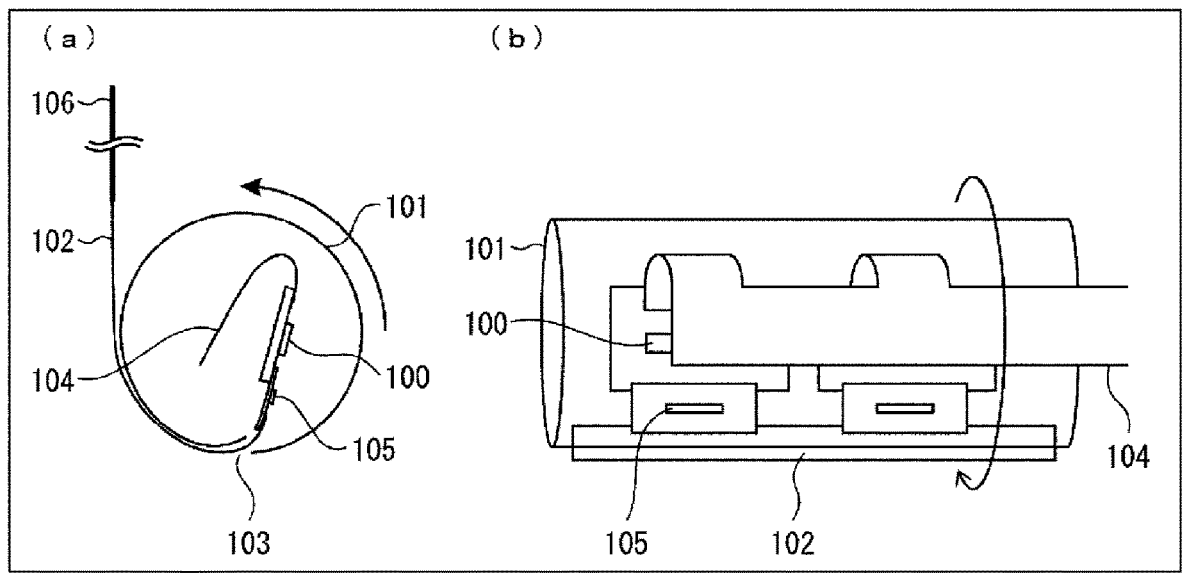
FIG. 5 is an explanatory diagram illustrating a display device of a known winding type.

As illustrated in FIG. 5, according to the known configuration described above, in order to achieve a housing and pull-out type display device, a drive substrate needs to be rotated together with the display device. This makes the structure of the display device complicated. Then, configurations (first to fourth embodiments) according to the disclosure in which it is unnecessary to rotate the drive substrate together will be exemplified and described in detail below.

First Embodiment

First, it is described below how the flexible display panel 1 (display area for display) is housed in the accommodation section 10 in a housing and pull-out type display device.

Figure 1:
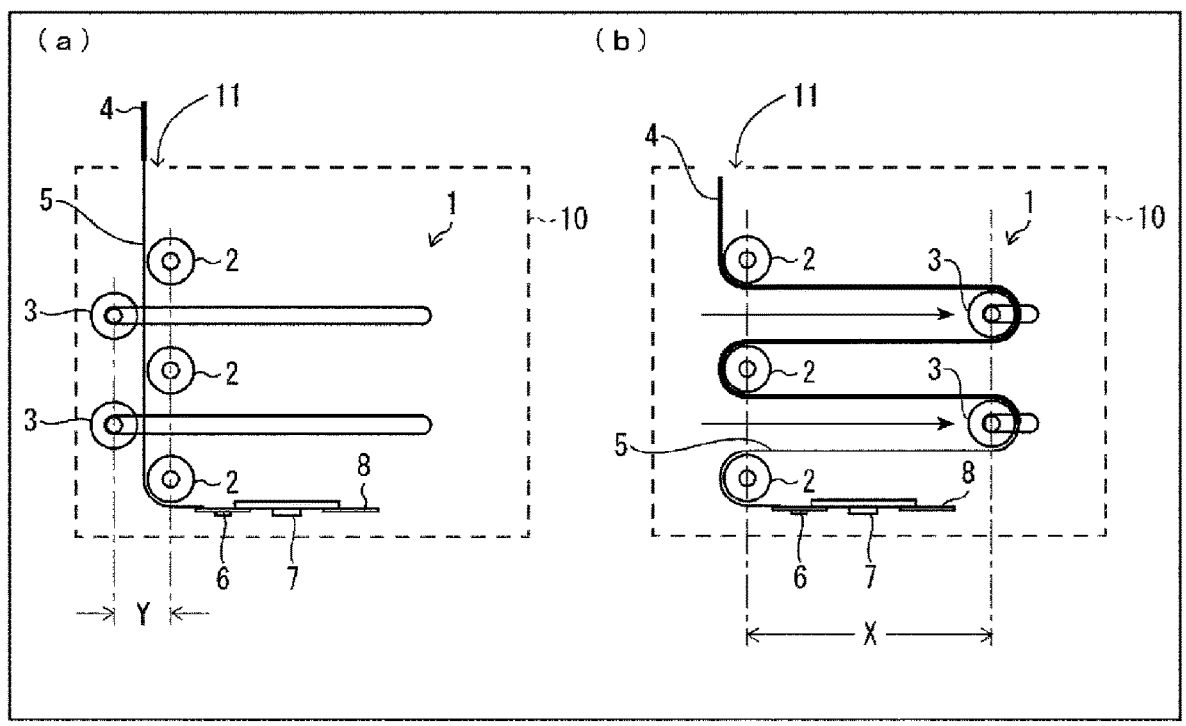
FIG. 1 includes explanatory diagrams illustrating a configuration of a display device according to a first embodiment.

(a) of FIG. 1 is an explanatory diagram illustrating a state in which the flexible display panel 1 is pulled out from the accommodation section 10 (the time of pull-out, that is, a case of displaying an image on the flexible display panel). (b) of FIG. 1 is an explanatory diagram illustrating a case in which the flexible display panel 1 is housed (the time of housing).

As illustrated in (a) and (b) of FIG. 1, the display device includes the flexible display panel 1 and the accommodation section 10. The display device includes a plurality of fixed guide members 2 formed of, for example, rollers and the like unable to move (fixed), and at least one movable guide member 3 formed of, for example, a roller and the like able to move. Note that FIG. 1 illustrates an example including two movable guide members 3 and three fixed guide members 2. The display device further includes a display area for display 4, a display wiring line area 5, a display driver-mounted flex substrate 6, a drive circuit substrate 7, an external connection cable 8, and the like.

Note that the movable guide member 3 is not limited to any specific member as long as the member is configured to change its position corresponding to the time of pull-out and the time of housing. For example, the distance between the at least one movable guide member and the plurality of fixed guide members at the time of pull-out is set to be different from that at the time of housing. Specifically, it is sufficient for the movable guide member 3 to be set such that the distance at a time of housing is longer than that at the time of pull-out (see FIG. 1(a)). As illustrated in FIG. 1(a), the plurality of fixed guide members 2 is provided in a straight line, for example.

In this case, it is sufficient for the plurality of fixed guide members 2 to be disposed at an interval longer than an outer shape of the movable guide member 3 at the time of housing the flexible display panel 1. In other words, it is sufficient that the at least one movable guide member 3 is disposed to have an outer shape which makes it possible to move passing through between the corresponding two fixed guide members 2 among the plurality of fixed guide members 2.

Each of the at least one movable guide member 3 and the plurality of fixed guide members 2 may be a cylindrical guide roller, for example, but no such limitation is intended, and any member that exhibits the same actions and effects as those of the cylindrical guide roller may be used.

Note that in this case, of the at least one movable guide member (guide roller) and the plurality of fixed guide members (guide rollers), a guide member (guide roller) closest to a pull-out portion 11 for the flexible display panel (for example, see (a) of FIG. 1) and a guide member (guide roller) farthest from the pull-out portion 11 are preferably fixed guide members (fixed guide rollers).

In particular, the guide roller closest to the pull-out portion 11 is the fixed guide roller, and preferably has the same diameter at a position corresponding to a display region and a position corresponding to a frame region of the flexible display panel. In this case, the flexible display panel 1 can be stably pulled out and housed. It is preferable that the display region and the frame region be provided to be in contact with the fixed guide roller. This is because the fixed guide roller is a guide roller that is close to the display region and uniformly makes contact with the flexible display panel, thereby stabilizing the state of pull-out.

As described above, the movable guide member 3 is configured to pass through between the corresponding two fixed guide members 2 and move a predetermined distance in a predetermined direction (for example, the direction indicated by an arrow in (b) of FIG. 1 and (c) of FIG. 1).

With the configuration described above, the flexible display panel 1 is reliably housed in the accommodation section 10 (see (b) of FIG. 1). Note that in the configuration example illustrated in FIG. 1, a case of two movable guide members 3 is described, but no such limitation is intended; the number of movable guide members 3 may be one or a plural number of not less than three.

The three fixed guide members 2 are disposed, for example, in a straight line and at an interval longer than the outer shape of the movable guide member 3. The three fixed guide members 2 are configured as follows. That is, when the flexible display panel 1 is housed, the two movable guide members 3 are each configured to move passing through between the corresponding two fixed guide members 2 among the three fixed guide members 2.

According to the above-described configuration, a distance between the movable guide member 3 and the corresponding two fixed guide members 2 at the time of housing can be made different from that at the time of pull-out. With this, the flexible display panel 1 may be reliably housed and pulled out.

The above-described distances may be set as follows, for example. That is, in a state in which the flexible display panel 1 is housed in the accommodation section 10 (see (b) of FIG. 1), the distance between each of the movable guide members 3 and the corresponding two fixed guide members is represented as X (see FIG. 1(b)). In a state in which the flexible display panel 1 is pulled out, the distance between each of the movable guide members 3 and the corresponding two fixed guide members is represented as Y (see FIG. 1(a)). In this case, it is sufficient that the distances X and Y are respectively set so that the distance X is longer than the distance Y.

By setting the distance X and the distance Y in this way, the flexible display panel 1 (display area for display 4) is reliably pulled out from the accommodation section 10 or is reliably housed in the accommodation section 10. When the flexible display panel 1 is pulled out from the accommodation section 10, the display wiring line area 5 is shaped in a straight line, whereby it is possible to shorten a distance between the display area for display 4 and the drive circuit substrate 7. In this manner, it is more preferable that the distance between the display area for display 4 and the drive circuit substrate 7 be shorter because of not being affected by attenuation, noise, and the like of drive signals of the flexible display panel 1.

As is clear from the above, the flexible display panel 1 (display area for display 4) can be reliably housed in or pulled out of the accommodation section 10 without moving the drive circuit substrate 7.

As a result, by moving the movable guide member 3 as described above, it is possible for the display device to achieve a configuration in which the flexible display panel 1 is housed in or pulled out of the accommodation section 10. The configuration of the display device differs from a configuration in which a flexible display panel is wound multiple times at the same location as in the known art.

Therefore, stress and scratches experienced on the flexible display panel 1 may be significantly and reliably reduced compared to the known art. Moreover, a connecting section of the flexible display panel 1 (the display driver-mounted flex substrate 6, the drive circuit substrate 7, the external connection cable 8, and the like) does not move while keeping the fixed state. Therefore, stress and scratches experienced on the connection section may be significantly and reliably reduced compared to the known art.

Note that in the configuration described above, the fixed guide members 2 and the movable guide members 3 are not limited to the action and arrangement described above. For example, only the fixed guide member 2 located at the lowest position in the accommodation section 10 may be fixed (not rotate), and the other fixed guide members 2 may be configured to rotate.

In (a) of FIG. 1, a plurality of the fixed guide members 2 and a plurality of the movable guide members 3 are respectively arranged in such a manner that the centers of the members are positioned in a straight line, but no such limitation is intended. As described above, it is sufficient that the respective members are appropriately arranged so that the flexible display panel 1 can be pulled out or housed.

Further, the arrangement, numbers, and the like of the fixed guide members 2 and the movable guide members 3 are not particularly limited as long as the flexible display panel 1 is configured to be pulled out or housed as described above by the movable guide members 3 being moved. For example, even when the movable guide members 3 are configured to move in a direction other than the direction depicted in (b) of FIG. 1 (for example, an oblique direction), the configuration may be acceptable as long as the same action effects as those described above are exhibited.

As described above, according to the first embodiment, the position of the movable guide member 3 can be changed at the time of pull-out and at the time of housing. The movable guide member 3 moves beyond the center axis of the plurality of fixed guide members 2. On the other hand, as for the fixed guide members 2, only the fixed guide member 2 on one end side (the fixed guide member 2 near the display driver-mounted flex substrate 6) may be fixed (not rotate), and the other fixed guide members 2 may be disposed so as to rotate.

In the above description, for example, in (a) of FIG. 1, the case in which a display surface of the flexible display panel 1 is configured to be positioned on one face side, that is, positioned between the fixed guide member 2 and the movable guide member 3 is described. However, the first embodiment is not limited to the above configuration, and also includes a case in which the display surface is configured to be positioned on the other side.

In any of the case in which the display surface is provided on the one face side and the case in which the display surface is provided on the other side, when a guide roller is used as the fixed guide member 2 located at the uppermost position, a flat roll is preferably adopted for performing stable pull-out or housing.

Second Embodiment

A second embodiment of the disclosure will be described below with reference to FIG. 2. Note that for the sake of convenience in description, members having the same functions as the members described in the first embodiment will be given the same reference signs, and descriptions thereof will be omitted.

In a housing and pull-out type display device of the second embodiment, a configuration to pull out a flexible display panel 1 is different from that of the first embodiment.

Figure 2:
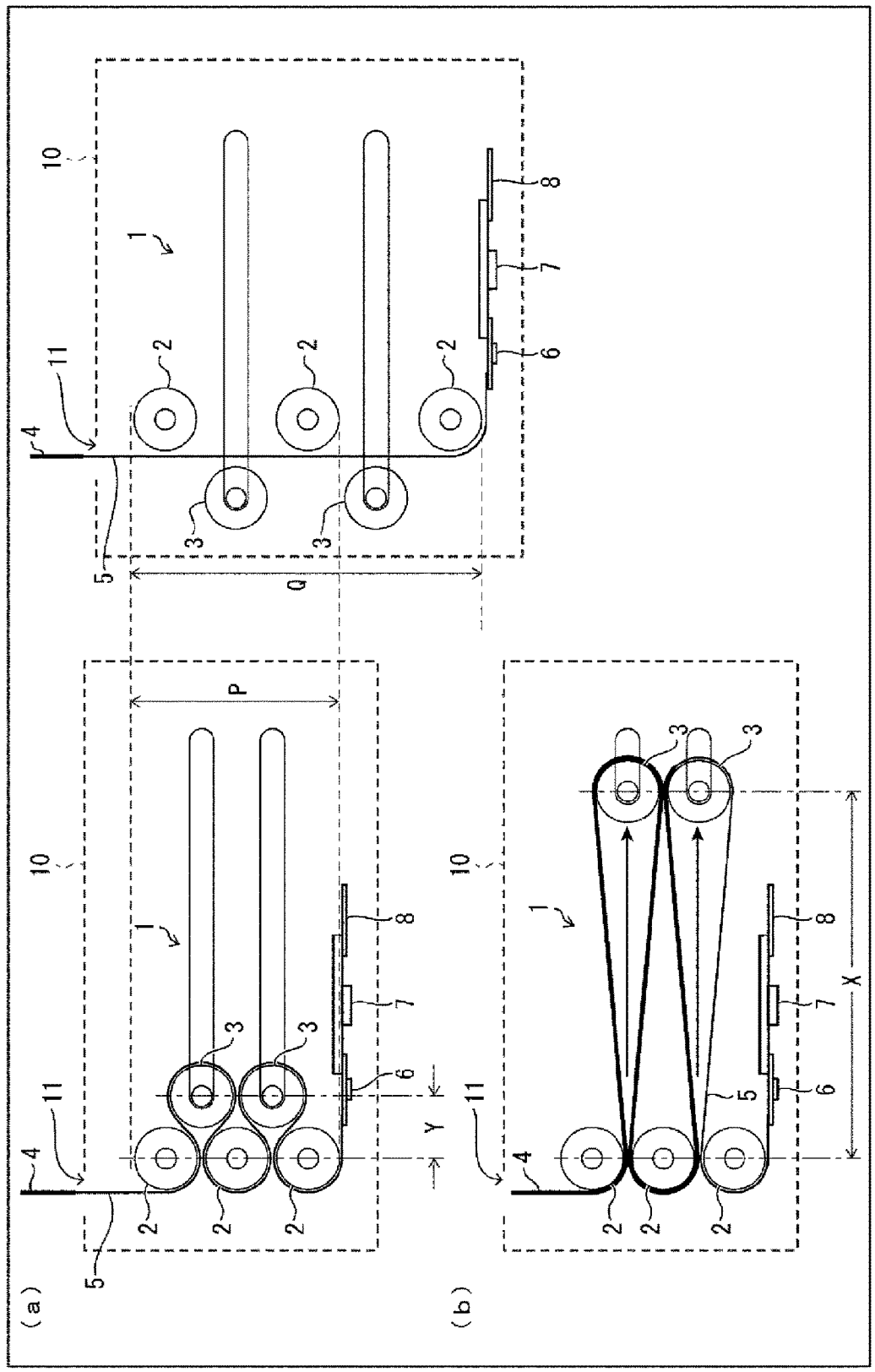
FIG. 2 includes explanatory diagrams illustrating a configuration of a display device according to a second embodiment.

The configuration of the second embodiment differs from the configuration of the first embodiment in a point that fixed guide members 2 and movable guide members 3 are disposed in the positions and at the intervals illustrated in FIG. 2. This point will be described below.

That is, according to the configuration of the first embodiment, each of the plurality of movable guide members 3 passes through between the corresponding two fixed guide members 2 and moves in a predetermined direction (the direction indicated by the arrow in (b) of FIG. 1 and (c) of FIG. 1). As a result, the flexible display panel 1 is housed in the accommodation section 10.

In contrast, according to the configuration of the second embodiment, three fixed guide members 2 are disposed in a straight line in such a manner that the distance between two fixed guide members 2 adjacent to each other is shorter than the outer shape of the movable guide member 3. In other words, each of the movable guide members 3 is configured to be unable to pass through between the corresponding two fixed guide members 2. Accordingly, at the time of housing, the movable guide member 3 is configured to move in a predetermined direction (the direction indicated by an arrow in (b) of FIG. 2).

At the time of housing the flexible display panel 1, the at least one movable guide member 3 is configured to move a predetermined distance toward an opposite side to a side on which the plurality of fixed guide members is provided when viewed from the at least one movable guide member 3. As a result, the flexible display panel 1 is reliably housed in the accommodation section 10.

According to the configuration of the second embodiment, a length at the time of pull-out (see a length P in FIG. 2(*a*)) becomes shorter than that of the configuration of the first embodiment (see a length Q in a drawing on the right side in (a) of FIG. 2), where P/Q is, for example, approximately ⅗, and the overall display device is reduced in size in accordance with that ratio.

On the other hand, the flexible display panel 1 is pulled out of the accommodation section 10 in the following manner. That is, the flexible display panel 1 moves a predetermined distance inside the accommodation section 10, and the movable guide member 3 being movable stops at a position of the pull-out time (moves in an opposite direction (not illustrated) to a direction indicated by an arrow in (b) of FIG. 2). With this, the flexible display panel 1 (display area for display 4) is reliably pulled out of the accommodation section 10.

Note that, in the case of the configuration of the second embodiment, when the flexible display panel 1 is to be housed in the accommodation section 10, the movable guide member 3 moves in the arrow direction illustrated in (b) of FIG. 2. Therefore, the movement distance thereof is longer than that of the case of the first embodiment by the size of the outer shape of the fixed guide member 2, and the length of the accommodation section 10 in the arrow direction illustrated in (b) of FIG. 2 becomes longer by the above-mentioned size.

Each of the at least one movable guide member 3 and the plurality of fixed guide members 2 may be a cylindrical guide roller, for example, but no such limitation is intended, and another member may be used in the configuration as long as the member performs the above-discussed action.

Third Embodiment

A third embodiment of the disclosure will be described below with reference to FIG. 3. For the sake of convenience in description, members having the same functions as the members described in the first and second embodiments will be given the same reference signs, and descriptions thereof will be omitted.

The fixed guide member 2 is configured to be disposed in such a manner as to make contact with a rear face of the flexible display panel 1. This contact does not cause the rear face of the flexible display panel 1 to experience stress, scratches, or the like.

On the other hand, in the movable guide member 3, a display surface of the flexible display panel 1 is disposed to be in contact with the fixed guide member 2. When disposed in this manner, the display surface of the flexible display panel 1 is damaged, and the display of the flexible display panel 1 is adversely affected.

To deal with this, the third embodiment further includes the following configurations in addition to the configuration of the first embodiment or the second embodiment.

Figure 3:
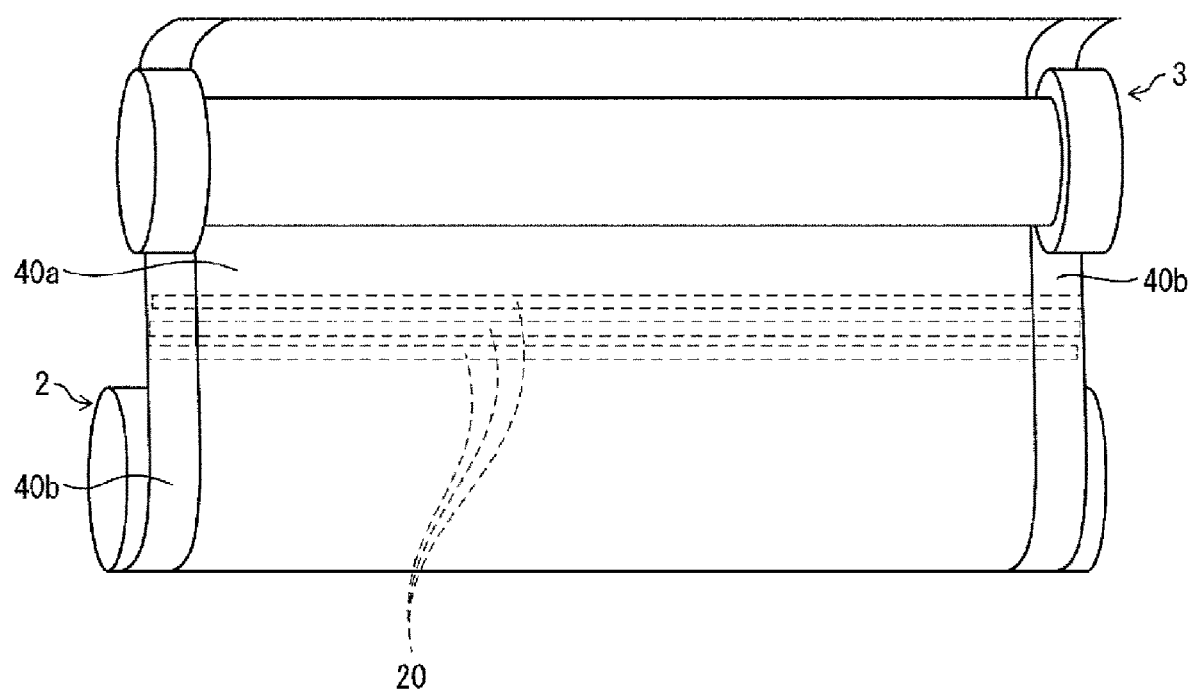
FIG. 3 is an explanatory diagram illustrating a configuration of a display device according to a third embodiment.

That is, according to the third embodiment, as illustrated in FIG. 3, a configuration 1 and a configuration 2 are included as follows. Specifically, the fixed guide member 2 is configured to hold the rear face of the flexible display panel 1 (the rear face of the display) on the entire surface of the fixed guide member 2 (configuration 1). In addition, the movable guide member 3 is configured to be in contact with only a frame region 40*b* (a region having no relationship with pixels) of a front face of the flexible display panel 1 so as not to affect the display (configuration 2).

Specifically, the fixed guide member 2 to be in contact with the flexible display panel 1 is configured such that the diameter thereof at a position corresponding to the frame region 40*b* is larger than that at a position corresponding to a display region 40*a* of the flexible display panel 1. The flexible display panel 1 and the fixed guide member 2 are configured to be brought into contact with each other in the frame region 40*b*.

According to the above-described configuration, the movable guide member 3 is configured to be in contact with the display surface of the flexible display panel 1, while the fixed guide member 2 is configured to be in contact with the rear face of the flexible display panel 1. As a result, the entire surface on the rear face side of the flexible display panel 1 is contacted, and therefore the operation of pulling out or housing the flexible display panel 1 can be stably performed with respect to the accommodation section 10.

Incidentally, when the inside of the screen of the flexible display panel 1 is pulled, the inside portion may be unfavorably rubbed, for example. To deal with this, it is preferable to pull only the outside of the screen having no relationship with pixels, or because a portion where nothing is present bends or the like, it is preferable to have a configuration in which friction is reduced by causing an installation area of the portion where neither of them is present to be small. The fixed guide member 2 being a guide member disposed farthest in the accommodation section 10 when viewed from the display area for display 4, does not need to rotate. For example, the fixed guide member 2 disposed farthest in FIG. 1 and FIG. 2 does not need to be rotated.

As the above-described configuration, the third embodiment is configured such that the movable guide member 3 makes contact with the display surface, and the fixed guide member 2 makes contact with the rear face of the display surface of the flexible display panel 1.

In the third embodiment, a reinforcing member 20 extending in parallel to a rotational axis of the guide member to connect the frame region 40*b* on one side and the frame region 40*b* on the other side is further provided on the non-display surface side of the flexible display panel 1 in order to achieve enforcement in the lateral direction in the rear face of the display surface. Note that in the description of the present specification, the guide member includes the fixed guide member 2 and the movable guide member 3.

The reinforcing member 20 preferably has an elongated shape and is provided in a bellows shape. By being providing in the bellows shape as described above, it is possible to respond to a change in the lateral direction in the rear face of the display surface by deforming flexibly.

For the sake of convenience in description, FIG. 3 exemplifies the case in which three of the reinforcing members 20 are provided, but the third embodiment is not limited thereto, and a plurality of the reinforcing members may be appropriately provided in locations where the flexible display panel 1 bends.

As described above, with the configuration in which the reinforcing members 20 are further provided, the bending of the screen of the flexible display panel 1 can be prevented in advance. Thus, the flexible display panel 1 can be pulled out of the accommodation section 10 or housed in the accommodation section 10 with reliability.

Fourth Embodiment

A fourth embodiment of the disclosure will be described below with reference to FIG. 4. Note that for the sake of convenience in description, members having the same functions as the members described in the first, second, and third embodiments will be given the same reference signs, and descriptions thereof will be omitted.

According to the movable guide member 3 in the third embodiment, only the frame region 40b of the flexible display panel 1 is held, but when the size of the flexible display panel 1 increases, the flexible display panel 1 may not be stably held.

Figure 4:
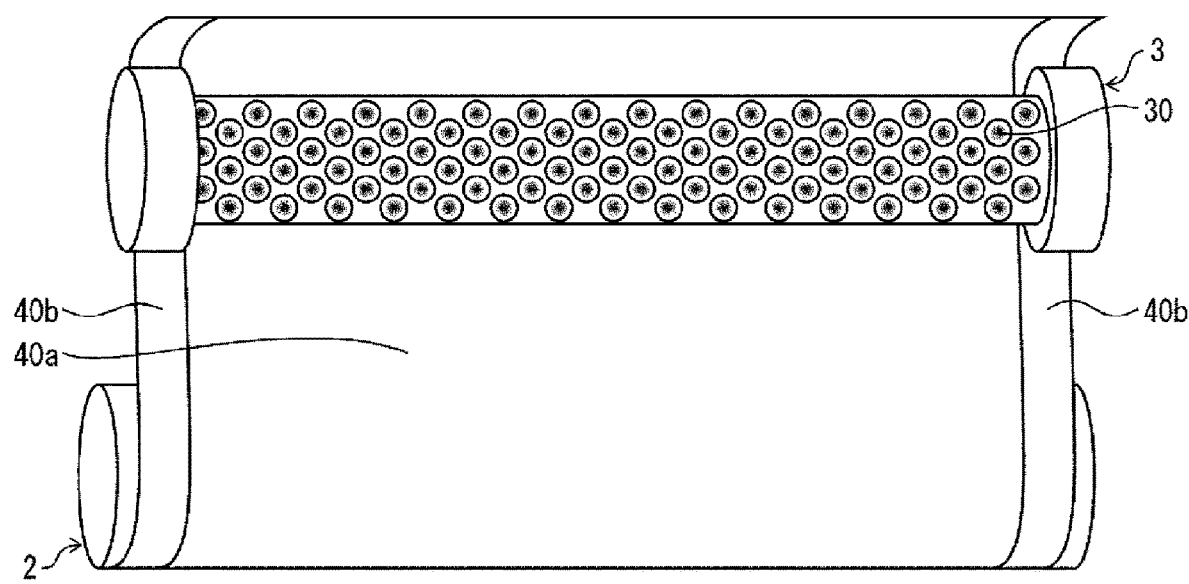
FIG. 4 is an explanatory diagram illustrating a configuration of a display device according to a fourth embodiment.

According to the fourth embodiment, as illustrated in FIG. 4, uneven formation processing is performed on a portion of a movable guide member 3 corresponding to the display region 40a of the flexible display panel 1 of the third embodiment. In the case of the configuration of FIG. 4, the roller diameter of a portion in contact with the frame region 40b is larger than that of a portion in contact with the display region 40a. In order to prevent the bending of the flexible display panel 1, a projection is required to be provided on the roller to be in contact with the display region 40a.

On the other hand, in a case of forming a recess, a recess 30 is required to be provided in the display region 40a while using a same-diameter roller in the display region 40a and the frame region 40b. The shape of the position of the movable guide member 3 corresponding to the display region 40a, where the recess 30 is formed, is made to have an uneven shape. By applying the uneven formation processing in this way, the display portion and the like are held and the friction generated is minimized.

For example, when the flexible display panel 1 is housed in the accommodation section 10, the configuration may be such that the recess 30 is provided in a support member so as to correspond to at least a location where an IC chip (not illustrated) or the like is provided.

Alternatively, the display device according to the fourth embodiment may have a configuration in which the movable guide member 3 is configured to include a plurality of projections (not illustrated) for preventing the bending.

Alternatively, the configuration may be such that the recess 30 is provided at least in a location that is subjected to rubbing, scratching, or the like. It is sufficient that the flexible display panel 1 is configured to be smoothly wound and housed in the accommodation section 10. This makes it possible to reliably and safely support the flexible display panel 1.

Alternatively, the display region 40a and the frame region 40b of the flexible display panel 1 may be configured to make contact with the fixed guide member 2.

Alternatively, in the state of the flexible display panel 1 being pulled out, guide members other than the guide member on the opposite side of the flexible display panel 1 may be rotatable among the nearest guide members.

Alternatively, a drive circuit (not illustrated) may further be provided between the movable guide member 2 and an external controller (not illustrated).

Alternatively, guide members other than the guide member closest to a substrate on which the drive circuit is provided may be rotatable.

Modified Example

As a modified example, the display device according to the disclosure may have a configuration combining the third embodiment and the first embodiment.

As a modified example, the display device according to the disclosure may have a configuration combining the third embodiment and the second embodiment.

As a modified example, the display device according to the disclosure may have a configuration combining the fourth embodiment and the first embodiment.

As a modified example, the display device according to the disclosure may have a configuration combining the fourth embodiment and the second embodiment.

According to the configurations of the above-described modified examples, action effects of the corresponding embodiments may be exhibited, so that the display devices with more favorable accuracy may be achieved.

Any of the flexible display panels 1 described in the first to fourth embodiments and the modified examples may include a self-luminous element such as an OLED, QLED or the like.

To be specific, the display element included in the flexible display panel 1 includes a display element whose luminance and permeability are controlled by current and a display element whose luminance and permeability are controlled by voltage.

For example, in each of the embodiments, an organic light emitting diode (OLED) may be provided as a current control display element. In this case, the flexible display panel according to each of the embodiments is an organic electro luminescence (EL) display panel.

Alternatively, in each of the embodiments, an inorganic light emitting diode may be provided as a current control display element. In this case, the flexible display panel according to each embodiment is an inorganic EL display panel. Likewise, in a case where a quantum dot light emitting diode (QLED) is provided, a QLED display panel is constituted.

Examples of a voltage control display element include a liquid crystal display element and the like.

Supplement

A display device according to a first aspect includes: a flexible display panel; and an accommodation section able to house the flexible display panel, and provided with at least one movable guide member being movable configured to support the flexible display panel and a plurality of fixed guide members configured to support the flexible display panel, wherein a distance between the at least one movable guide member and the plurality of fixed guide members at a time of pull-out is different from the distance between the at least one movable guide member and the plurality of fixed guide members at a time of housing.

In a display device according to a second aspect, the distance between the at least one movable guide member and the plurality of fixed guide members at a time of housing is longer than the distance between the at least one movable guide member and the plurality of fixed guide members at the time of pull-out.

In a display device according to a third aspect, of the at least one movable guide member and the plurality of fixed guide members, a guide member closest to a pull-out portion for the flexible display panel and a guide member farthest from the pull-out portion are fixed guide members.

In a display device according to a fourth aspect, the plurality of fixed guide members is disposed in a straight line and at an interval longer than an outer shape of the at least one movable guide member in a side view. Further, in a case that the flexible display panel is to be housed, the at least one movable guide member is provided to move passing through between the corresponding two fixed guide members among the above-described fixed guide members.

In a display device according to a fifth aspect, in a side view, the plurality of fixed guide members is disposed in a straight line, and in a case that the flexible display panel is to be housed, the at least one movable guide member is configured to move a predetermined distance toward an opposite side to a side on which the plurality of fixed guide members is provided in a view from the at least one movable guide member.

In a display device according to a sixth aspect, the plurality of fixed guide members is provided at an interval shorter than the outer shape of the at least one movable guide member.

In a display device according to a seventh aspect, each of the at least one movable guide member and the plurality of fixed guide members is a cylindrical guide roller.

In a display device according to an eighth aspect, the flexible display panel includes a display region and frame regions on both sides of the display region, at least one of the guide rollers to be in contact with the flexible display panel has a diameter longer at a position corresponding to the frame region than a diameter at a position corresponding to the display region, and the flexible display panel and the guide roller make contact with each other in the frame region.

In a display device according to a ninth aspect, the at least one guide roller makes contact with a display surface side of the flexible display panel.

In a display device according to a tenth aspect, a reinforcing member extending in parallel to a rotational axis of the guide roller to connect the frame region on one side and the frame region on the other side is provided on a non-display surface side of the flexible display panel.

In a display device according to an eleventh aspect, the reinforcing member has an elongated shape and is provided in a bellows shape.

In a display device according to a twelfth aspect, a shape of the guide roller at a position corresponding to the display region takes an uneven shape.

In a display device according to a thirteenth aspect, a pull-out portion for the flexible display panel is further provided in the accommodation section, and a guide roller closest to the pull-out portion is a fixed guide roller and has a same diameter at a position corresponding to the display region and a position corresponding to the frame region of the flexible display panel.

In a display device according to a fourteenth aspect, the display region and the frame region of the flexible display panel are brought into contact with the fixed guide roller.

In a display device according to a fifteenth aspect, the flexible display panel further includes a display area for display, and a guide member other than a guide member disposed farthest in the accommodation section in a view from the display area for display is rotatable.

In a display device according to a sixteenth aspect, the flexible display panel further includes a flex cable connected to the flexible display panel; a drive circuit substrate configured to supply a signal to the flexible display panel; an external connection cable connected to the drive circuit substrate; and an external controller connected to the external connection cable and configured to supply a signal to the drive circuit substrate, where the drive circuit substrate is further provided between the movable guide member and the external controller.

In a display device according to a seventeenth aspect, a guide member other than a guide member closest to the substrate on which the above-described drive circuit is provided is rotatable.

The invention claimed is:

1. A display device comprising:
a flexible display panel; and
an accommodation section able to house the flexible display panel, and provided with at least one movable guide member being movable configured to support the flexible display panel and a plurality of fixed guide members configured to support the flexible display panel,
wherein a distance between the at least one movable guide member and the plurality of fixed guide members at a time of pull-out is different from the distance between the at least one movable guide member and the plurality of fixed guide members at a time of housing,
wherein, in a side view, the plurality of fixed guide members is disposed in a straight line, and in a case that the flexible display panel is to be housed, the at least one movable guide member is configured to move a predetermined distance toward an opposite side to a side on which the plurality of fixed guide members is provided in a view from the at least one movable guide member,
wherein the plurality of fixed guide members is provided at an interval shorter than an outer shape of the at least one movable guide member.

2. The display device according to claim 1, wherein the distance between the at least one movable guide member and the plurality of fixed guide members at a time of housing is longer than the distance between the at least one movable guide member and the plurality of fixed guide members at the time of pull-out.

3. The display device according to claim 1, wherein, of the at least one movable guide member and the plurality of fixed guide members, a guide member closest to a pull-out portion for the flexible display panel and a guide member farthest from the pull-out portion are fixed guide members.

4. The display device according to claim 1, wherein each of the at least one movable guide member and the plurality of fixed guide members is a cylindrical guide roller.

5. The display device according to claim 4, wherein the flexible display panel includes a display region and frame regions on both sides of the display region,
at least one of the guide rollers to be in contact with the flexible display panel has a diameter longer at a position corresponding to the frame region than a diameter at a position corresponding to the display region, and
the flexible display panel and the guide roller make contact with each other in the frame region.

6. The display device according to claim 5, wherein the at least one guide roller makes contact with a display surface side of the flexible display panel.

7. The display device according to claim 6, wherein a reinforcing member extending in parallel to a rotational axis of the guide roller to connect the frame region on one side and the frame region on the other side is provided on a non-display surface side of the flexible display panel.

8. The display device according to claim 7, wherein the reinforcing member has an elongated shape and is provided in a bellows shape.

9. The display device according to claim 5, wherein a shape of the guide roller at a position corresponding to the display region takes an uneven shape.

10. The display device according to claim 4,
wherein a pull-out portion for the flexible display panel is further provided in the accommodation section, and
a guide roller closest to the pull-out portion is a fixed guide roller and has a same diameter at a position corresponding to a display region and a position corresponding to a frame region of the flexible display panel.

11. The display device according to claim 10,
wherein the display region and the frame region of the flexible display panel are brought into contact with the fixed guide roller.

12. The display device according to claim 1,
wherein the flexible display panel further includes a display area for display, and a guide member other than a guide member disposed farthest in the accommodation section in a view from the display area for display is rotatable.

\* \* \* \* \*